(12) United States Patent
Murata (10) Patent No.: US 10,310,939 B2
(45) Date of Patent: Jun. 4, 2019

(54) SEMICONDUCTOR MEMORY SYSTEM AND DATA WRITING METHOD

(71) Applicant: LAPIS Semiconductor Co., Ltd., Yokohama (JP)

(72) Inventor: Nobukazu Murata, Yokohama (JP)

(73) Assignee: LAPIS Semiconductor Co., Ltd., Yokohama (JP)

(*) Notice: Subject to any disclaimer, the term of this patent is extended or adjusted under 35 U.S.C. 154(b) by 14 days.

(21) Appl. No.: 15/154,480

(22) Filed: May 13, 2016

(65) Prior Publication Data
US 2016/0335157 A1    Nov. 17, 2016

(30) Foreign Application Priority Data
May 15, 2015    (JP) .................. 2015-099947

(51) Int. Cl.
| | |
|---|---|
| *G06F 3/06* | (2006.01) |
| *G11C 7/10* | (2006.01) |
| *G06F 11/10* | (2006.01) |
| *G11C 16/08* | (2006.01) |
| *G11C 16/10* | (2006.01) |
| *G11C 16/26* | (2006.01) |
| *G11C 29/04* | (2006.01) |
| *G11C 29/52* | (2006.01) |

(52) U.S. Cl.
CPC .......... *G06F 11/1068* (2013.01); *G06F 3/064* (2013.01); *G06F 3/0619* (2013.01); *G06F 3/0688* (2013.01); *G11C 7/1006* (2013.01); *G11C 16/08* (2013.01); *G11C 16/10* (2013.01); *G11C 16/26* (2013.01); *G11C 29/52* (2013.01); *G11C 2029/0411* (2013.01)

(58) Field of Classification Search
CPC ............. G06F 11/1008; G06F 11/1068; G06F 11/1072; G06F 11/1048; G11C 11/5628; G11C 29/42; G11C 11/5642
USPC ........................................................ 714/763
See application file for complete search history.

(56) References Cited

U.S. PATENT DOCUMENTS

| | | | | |
|---|---|---|---|---|
| 8,656,255 | B1* | 2/2014 | Nemazie | G06F 11/1008 365/133 |
| 2008/0184094 | A1* | 7/2008 | Murray | G06F 11/1072 714/763 |
| 2009/0319840 | A1* | 12/2009 | Hara | G06F 11/1068 714/718 |

(Continued)

FOREIGN PATENT DOCUMENTS

JP    2012-133843 A    7/2012

*Primary Examiner* — James C Kerveros
(74) *Attorney, Agent, or Firm* — Rabin & Berdo, P.C.

(57) ABSTRACT

On the basis of data addresses indicative of write bit positions of each of the write data pieces in each of blocks, write page addresses indicative of pages having each of the write data pieces written thereto in each of the blocks are detected. At least one write data piece is incorporated into each of the page data pieces indicated by the write page addresses among k page data pieces corresponding to the k pages, the page data pieces having the write data pieces incorporated therein are used as page data pieces, and an error-correction encoding process is applied to each of the write page data pieces to obtain encoded write data pieces. Then, a voltage based on the encoded write data pieces is applied to each of the memory cells belonging to the pages indicated by the write page addresses.

3 Claims, 6 Drawing Sheets

(56) References Cited

U.S. PATENT DOCUMENTS

| | | | |
|---|---|---|---|
| 2010/0122147 A1* | 5/2010 | Kanno | G11C 16/3418 |
| | | | 714/763 |
| 2012/0159284 A1* | 6/2012 | Ohta | G06F 11/1068 |
| | | | 714/763 |
| 2013/0179751 A1* | 7/2013 | Linstadt | G06F 11/1048 |
| | | | 714/763 |
| 2013/0198589 A1* | 8/2013 | Choi | G06F 11/1072 |
| | | | 714/773 |
| 2015/0046770 A1* | 2/2015 | Luo | G11C 29/12005 |
| | | | 714/764 |
| 2015/0074489 A1* | 3/2015 | Kashiwagi | G11C 7/10 |
| | | | 714/763 |
| 2015/0212880 A1* | 7/2015 | Carissimi | G06F 11/1048 |
| | | | 714/764 |
| 2015/0212881 A1* | 7/2015 | Conte | G06F 11/1068 |
| | | | 714/764 |

* cited by examiner

SEMICONDUCTOR MEMORY SYSTEM AND DATA WRITING METHOD

BACKGROUND OF THE INVENTION

1. Field of the Invention

The present invention relates to a semiconductor memory system, and more particularly relates a non-volatile semiconductor memory system and a data writing method for writing data in the semiconductor memory system.

2. Description of the Related Art

As non-volatile semiconductor memories, NAND or NOR flash memories are known. The NAND flash memory includes so-called an ECC (error checking and correcting) which applies error detection and correction to write data and read data to enhance data reliability (see, for example, Japanese Patent Application Laid-Open No. 2012-133843). In data writing with the ECC, an encoding process for error correction is applied to a series of input write data pieces in one page unit corresponding to a plurality of memory cells connected to each word line. The encoded data for each page obtained by the encoding process is written to a memory cell array. During data reading, error correction is applied to the encoded data read in the page unit, and the error-corrected data is output as read data.

SUMMARY OF THE INVENTION

The NOR flash memory, which is generally high in data reliability, does not need ECC which is necessary for the NAND flash memory. However, in recent years, as the memory is demanded to have higher-density recording performance and higher speed, the NOR flash memory also has deterioration in data reliability.

In the NOR flash memory, for example, data is read in a page unit consisting of 128-bits, while data is written in a block unit consisting of plural pages which are as large as 100 pages, for example.

Therefore, in the NOR flash memory, one write access is conducted in the block unit as described before, so that the length of data subjected to error detection and correction is larger. As a result, it takes longer time to perform an error detection and correction process, which results in slowed data access (write and read) speed.

When a write access in the block unit is performed in the NOR flash memory, write data pieces in a series of input write data pieces are each first incorporated as bit data in page data each corresponding to a plurality of pages in one block. In the NOR flash memory, each page data for one block, into which the write data pieces were incorporated, is written to a memory cell array.

In the NOR flash memory, a series of the input write data pieces are not necessarily incorporated into the page data in succession in order of the series. For example, a series of the write data pieces may each be incorporated so as to be distributed over a plurality of page data.

Therefore, since the NOR flash memory may be configured such that input write data pieces may be different in sequence from read data pieces read per page, error correction by the method adopted in the NAND flash memory cannot be applied to the NOR flash memory.

Accordingly, an object of the present invention is to provide a semiconductor memory system and a data writing method, which can perform highly reliable memory access using ECC without causing increase in access time even when input write data pieces are different in sequence from read data pieces.

A semiconductor memory system according to the present invention is configured to include a plurality of memory cells, to receive write data pieces consecutively applied thereto, and to memorize the write data pieces in the memory cells while performing an access per a block unit consisting of k-pages (k is an integer of 2 or more), the semiconductor memory system including: a write page address detector configured to detect, on the basis of data addresses indicative of write bit positions of each of the write data pieces in each of the blocks, write page addresses indicative of the pages having each of the write data pieces written thereto; a write buffer configured to incorporate at least one of the write data pieces into each of page data pieces indicated by the write page addresses among k page data pieces corresponding to the k pages and to obtain the page data pieces having the write data pieces incorporated therein as write page data pieces; an ECC part configured to apply an error-correction encoding process to each of the write page data pieces to obtain encoded write data pieces; and a decoder configured to apply a writing voltage based on the encoded write data pieces to each of the memory cells belonging to the pages indicated by the write page addresses.

A data writing method according to the present invention is a data writing method for writing write data pieces in memory cells while performing an access per a block unit consisting of k-pages (k is an integer of 2 or more), said data writing method comprising: a first step of detecting, on the basis of data addresses indicative of write bit positions of each of the write data pieces in each of the blocks, write page addresses indicative of the pages having each of the write data pieces written thereto; a second step of incorporating at least one of the write data pieces into each of the page data pieces indicated by the write page addresses among k page data pieces corresponding to the k pages and using the page data pieces having the write data pieces incorporated therein as write page data pieces; a third step of applying an error-correction encoding process to each of the write page data pieces to obtain encoded write data pieces; and a fourth step of applying a writing voltage based on the encoded write data pieces to each of the memory cells belonging to the pages indicated by the write page addresses.

In the present invention, when write data pieces are written to memory cells in a block unit consisting of k pages, write page addresses indicative of the pages having each of the write data pieces written thereto in each of the blocks are first detected on the basis of data addresses indicative of write bit positions in each of the blocks. Next, at least one write data piece is incorporated into the page data pieces indicated by the write page addresses out of k page data pieces corresponding to each of the pages. Then, the error-correction encoding process is applied only to each of the page data pieces with the write data pieces incorporated therein, and the resultant encoded write data pieces are written to each of the memory cells.

Therefore, according to the present invention, highly reliable data access can be performed using ECC even when input write data pieces are different in sequence from read data pieces.

Furthermore, in the present invention, the error-correction encoding process is applied only to the page data having each of the write data pieces incorporated therein. Accordingly, as compared with the case where the error-correction encoding process is applied to all the page data in one block, increase in access time due to the time taken for the process can be suppressed.

DETAILED DESCRIPTION OF THE INVENTION

Hereinbelow, an embodiment of the present invention will be described in detail with reference to the accompanying drawings.

Figure 1:
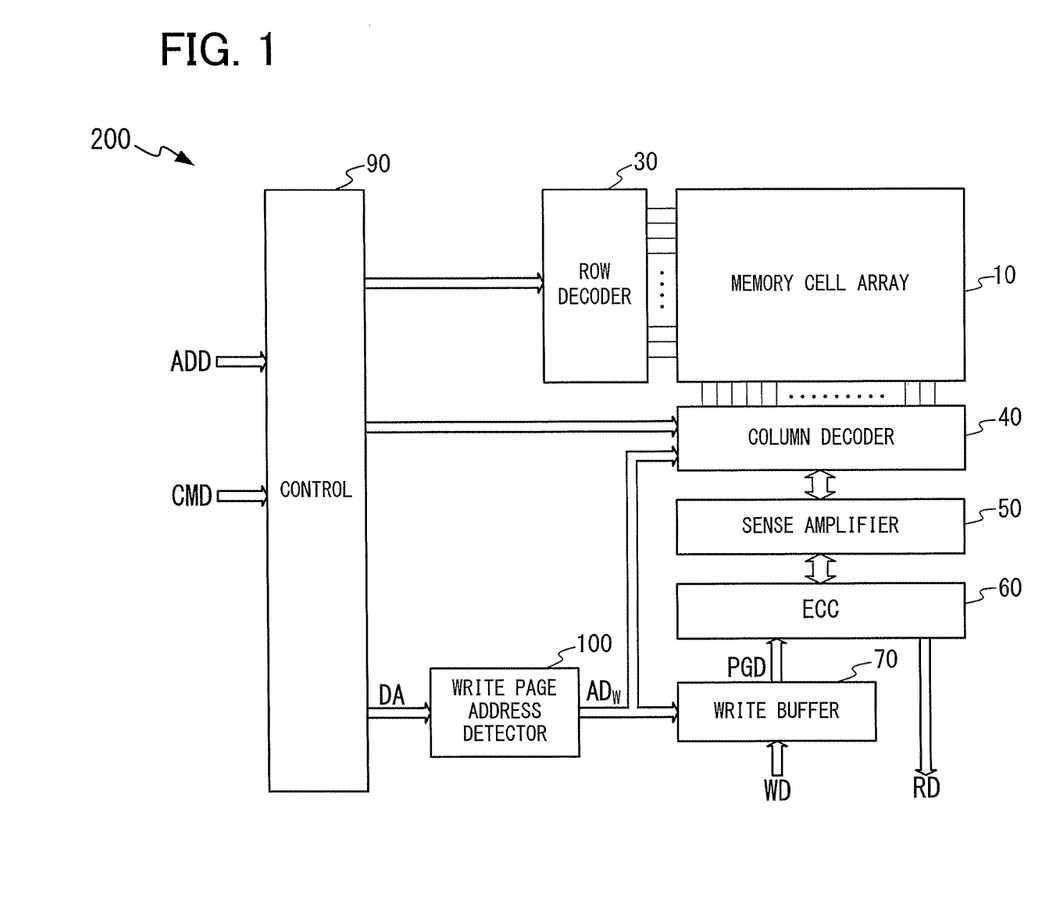
FIG. 1 is a block diagram illustrating a schematic configuration of a NOR flash memory 200 as a semiconductor memory system according to the present invention.

FIG. 1 is a block diagram illustrating a schematic configuration of a NOR flash memory 200 as a semiconductor memory system according to the present invention. In FIG. 1, a memory cell array 10 includes a plurality of word lines and a plurality of bit lines. Memory cells are arranged at each crossing part between the plurality of word lines and the plurality of bit lines. One unit of data which is stored in a plurality of memory cells connected to a same word line and in a memory cell group connected to one word line is referred to as a page. In the memory cell array 10, data is written for each block of consisting of 100-pages, for example.

A row decoder 30 selects, from among word lines of the memory cell array 10, a word line corresponding to a block indicated by a block address ADb, and applies a voltage necessary for data read, data write, and data erase to the selected word line.

A column decoder 40 reads data by applying a read voltage to a bit line or a bit line group corresponding to a page address indicated by the column address ADc or a data address indicative of a bit position in a block. In this operation, the column decoder 40 supplies each of read signals read by each of the bit lines to a sense amplifier 50.

During data writing, the column decoder 40 applies a writing voltage based on encoded write data PD supplied via the sense amplifier 50 to each bit line connected to each of the memory cells belonging to the page indicated by the write page address ADw. As a result, the column decoder 40 writes the encoded write data PD to the memory cell array 10.

During data reading, the sense amplifier 50 detects and amplifies potential fluctuation of a read signal read by each bit line to identify binary or multivalue data, and supplies the identified data to the ECC part 60 as encoded read data. During data writing, the sense amplifier 50 directly supplies the encoded write data PD supplied from the ECC part 60 to the column decoder 40.

The ECC part 60 applies an error detection and correction process to the encoded read data supplied from the sense amplifier 50 to correct bit error or burst error in the encoded read data, and outputs the error-corrected data as read data RD.

Figure 2:
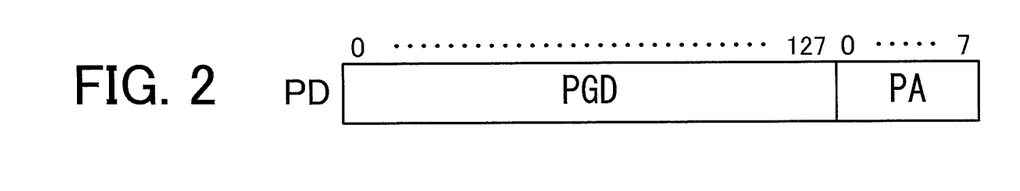
FIG. 2 is a diagram illustrating one example of a data format of encoded write data PD.

The ECC part 60 also applies the error correction process to page data PGD for each page supplied from a write buffer 70 to generate encoded write data PD with parity bits added thereto. For example, the ECC part 60 applies the error-correction encoding process to the page data PGD with a 128-bit length as illustrated in FIG. 2 to generate encoded write data PD with 8 parity bits PA added thereto. The ECC part 60 supplies the encoded write data PD to the column decoder 40 via the sense amplifier 50.

Figure 3:
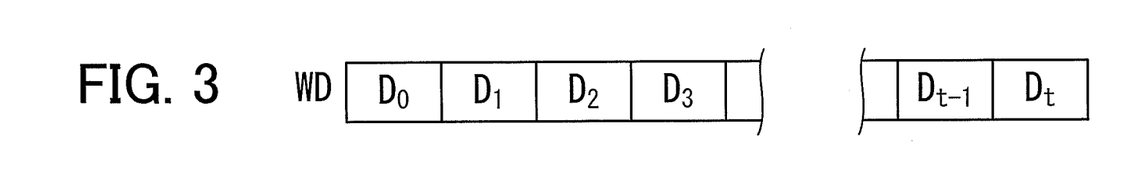
FIG. 3 is a diagram illustrating one example of a data format of input write data WD.

The write buffer 70 loads a series of write data $D_0$ to $D_t$ (t is an integer of 2 or more) as input write data WD as illustrated in FIG. 3, for example. Each of the write data $D_0$ to $D_t$ has a 16-bit length, for example.

First, the write buffer 70 sets page data $PGD_0$ to $PGD_k$, in which all the bits are initialized to have a logic level 0 or 1, as k pieces of page data (k is an integer of 2 or more) for one block. Next, the write buffer 70 incorporates each of the write data $D_0$ to $D_t$ as data positioned at specified bit positions in page data PGD indicated by write page addresses ADw.

Figure 4:
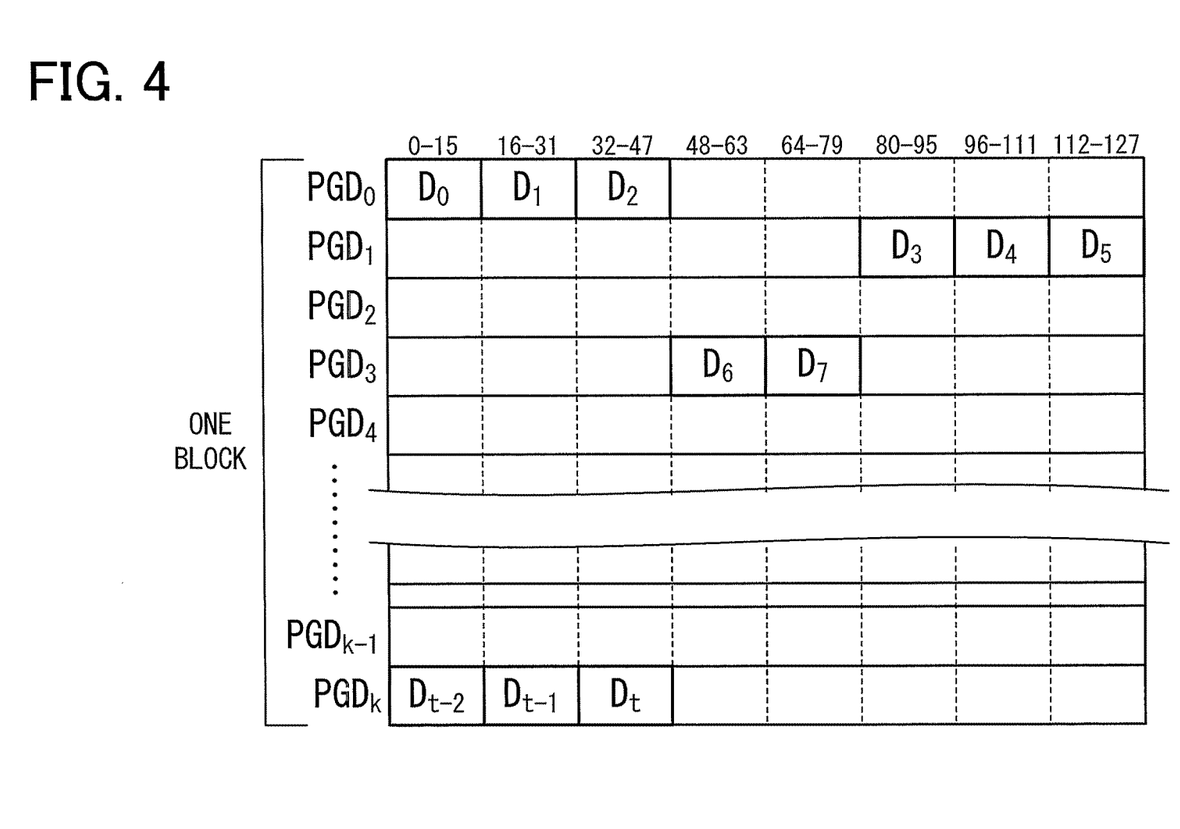
FIG. 4 is a diagram illustrating one example of write data $D_0$ to $D_t$ incorporated into page data $PGD_0$ to $PGD_k$ for one block.

For example, when the write page addresses ADw corresponding to each of the write data $D_0$ to D2 indicate 0th bit to 47th bit of the page data $PGD_0$, the write buffer 70 incorporates the write data $D_0$ to $D_2$ as 0th-bit to 47th-bit data in the page data $PGD_0$ as illustrated in FIG. 4, for example. When the write page addresses ADw corresponding to each of the write data $D_3$ to $D_5$ indicate 80th bit to 127th bit in the page data $PGD_1$, the write buffer 70 incorporates the write data $D_3$ to $D_5$ as 80th-bit to 127th-bit data in the page data $PGD_1$ as illustrated in FIG. 4. When the write page addresses ADw corresponding to each of the write data $D_6$ and $D_7$ indicate 48th bit to 79th bit in the page data $PGD_3$, the write buffer 70 incorporates the write data $D_6$ and $D_7$ as 48th-bit to 79th-bit data in the page data $PGD_3$ as illustrated in FIG. 4. When the write page addresses ADw corresponding to each of the write data $D_{(t-2)}$ to $D_t$ indicate 0th bit to 47th bit in the page data $PGD_k$, the write buffer 70 incorporates the write data$D_{(t-2)}$ to $D_t$ as 0th-bit to 47th-bit data in the page data $PGD_k$ as illustrated in FIG. 4.

The write buffer 70 then supplies, among the page data $PGD_0$ to $PGD_k$ for one block, only the page data into which the write data $D_0$ to $D_t$ are incorporated, i.e., only the page data PGD corresponding to the pages indicated by the write page addresses ADw, to the ECC part 60. In one example illustrated in FIG. 4, for example, the write buffer 70 supplies at least each of $PGD_0$, $PGD_1$, $PGD_3$, and $PGD_k$ corresponding to the pages indicated by the write page addresses ADw, among the page data $PGD_0$ to $PGD_k$, to the ECC part 60. The write buffer 70 does not supply at least each of $PGD_2$, $PGD_4$, and $PGD_{(k-1)}$ corresponding to the pages which are not indicated by the write page addresses ADw, to the ECC part 60.

A control part 90 supplies the above-described block addresses ADb and the column addresses ADc to the row decoder 30 and the column decoder 40 in accordance with various control commands CMD, such as a chip enable signal, a write signal, and a read signal supplied from the outside, and address data ADD.

During data writing, in accordance with the address data ADD, the control part 90 supplies data addresses DA indicative of write bit positions of each of the write data $D_0$ to $D_t$ as the input write data WD in a block to a write page address detector 100.

On the basis of the data addresses DA corresponding to each of the write data $D_0$ to $D_t$, the write page address detector 100 detects page addresses indicative of write target pages, among all the pages for one block, and supplies the detected page addresses to the column decoder 40 and the write buffer 70 as the write page addresses ADw.

Figure 5:
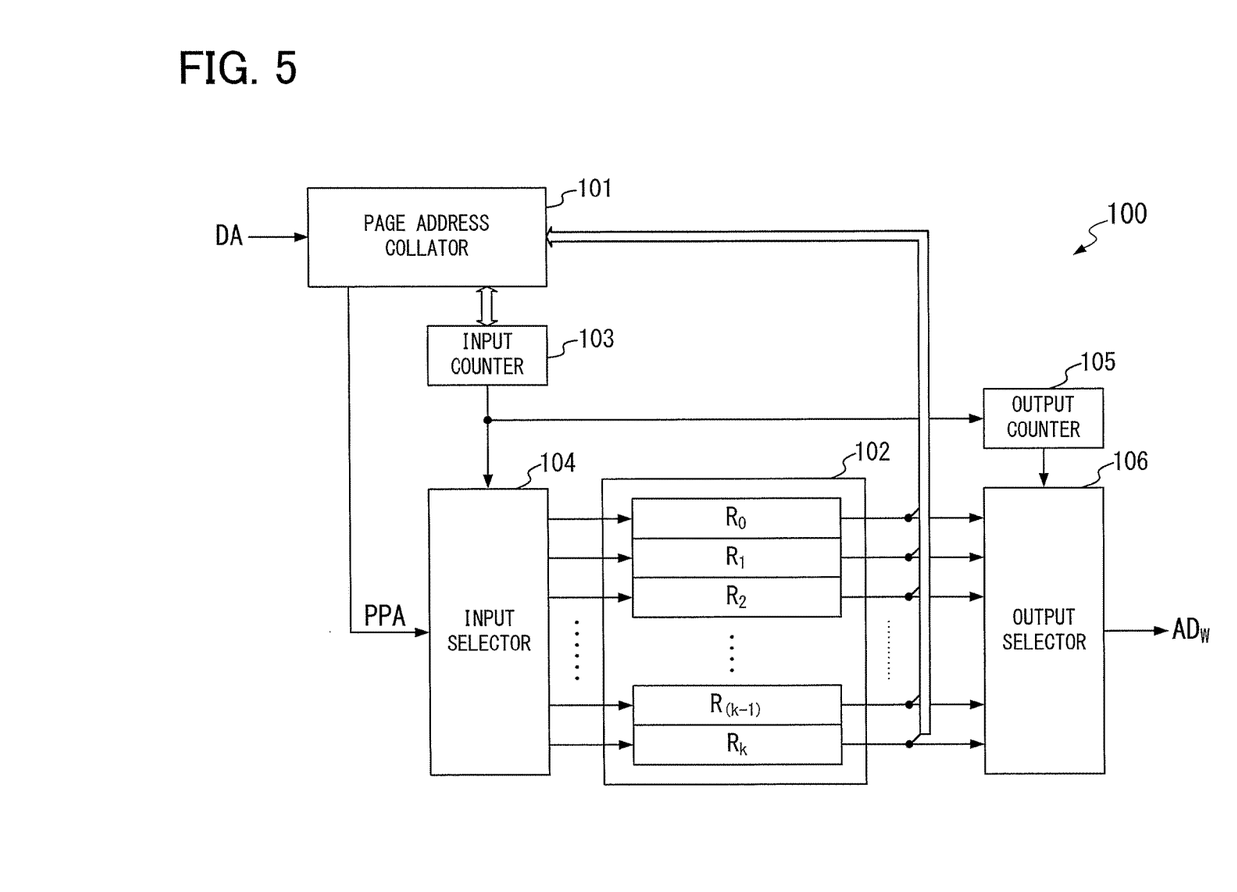
FIG. 5 is a block diagram illustrating one example of an internal configuration of a write page address detector 100.

FIG. 5 is a block diagram illustrating an internal configuration of the write page address detector 100. As illustrated in FIG. 5, the write page address detector 100 includes a page address collator 101, a write page address storage 102, an input counter 103, an input selector 104, an output counter 105, and an output selector 106.

The page address collator 101 determines pages including the write bit positions indicated by the data addresses DA, and obtains a page address PPA indicative of the determined pages. The page address collator 101 determines whether or not the pages indicated by the page address PPA are already stored in the write page address storage 102. That is, the page address collator 101 collates a page address PPA with contents stored in the write page address storage 102 to determine whether or not the page address identical to the page address PPA is already stored in the write page address storage 102. In this operation, only when it is determined that the page address identical to the page address PPA is not stored, the page address collator 101 supplies the page address PPA to the input selector 104, and continues to increment a count value of the input counter 103 by 1.

The write page address storage 102 includes page address registers $R_0$ to $R_k$ corresponding to each of (k+1) pages for one block. Among the page address registers $R_0$ to $R_k$, one page address register R, to which the page address PPA is supplied from the input selector 104, stores the page address PPA. The page address registers $R_0$ to $R_k$ supply the contents stored in each of the registers to the page address collator 101 and the output selector 106.

The input counter 103 initializes its count value to zero at power-on or whenever writing of data for one block to the memory cell array 10 is finished. Whenever the page address collator 101 determines that the page address identical to the page address PPA is not stored, the input counter 103 increments its counter value by 1.

The input selector 104 selects one page address register corresponding to the count value of the input counter 103, from among the page address registers $R_0$ to $R_k$, and supplies the page address PPA to the selected page address register R. For example, when the input counter 103 has a count value of zero, the input selector 104 supplies the page address PPA only to the page address register $R_0$ among the page address registers $R_0$ to $R_k$. Hence, the page address register $R_0$ stores the page address PPA supplied from the input selector 104. When the input counter 103 has a count value of "1", the input selector 104 supplies the page address PPA only to the page address register $R_1$ among the page address registers $R_0$ to $R_k$. Hence, the page address register $R_1$ stores the page address PPA supplied from the input selector 104.

The output counter 105 initializes its count value to zero at power-on or whenever data writing for one block to the memory cell array 10 is finished. When all the processes to store page addresses in the write page address storage 102 on the basis of the above-described input write data WD are finished, the output counter 105 starts count operation. In this operation, the output counter 105 increments the count value from zero by "1", and once the count value is matched with a current count value of the input counter 103, the output counter 105 stops the count operation.

The output selector 106 sequentially and alternatively selects memory contents of each page address register R in the write page address storage 102, i.e., the page addresses indicative of write target pages, on the bases of the count value of the output counter 105. The output selector 106 outputs the selected memory contents as the above-described write page addresses ADw.

Figure 6:
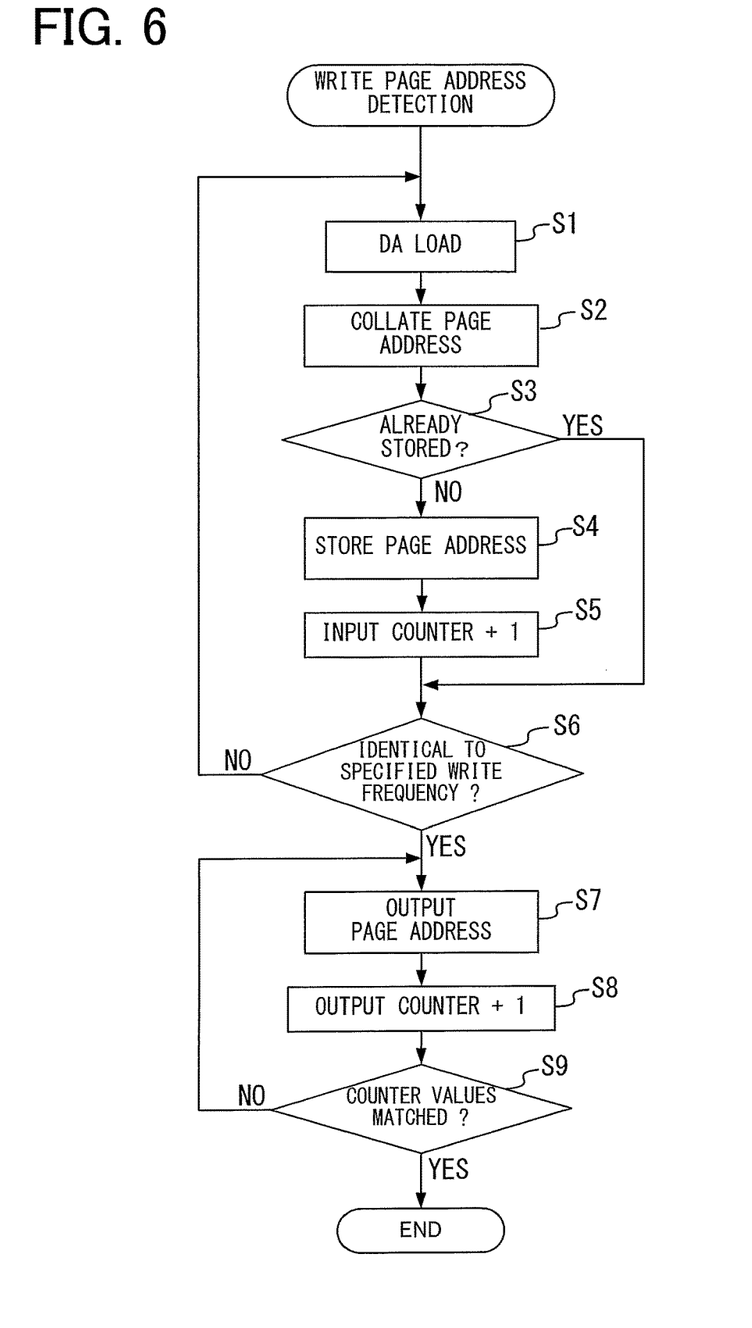
FIG. 6 is a flow chart illustrating a write page address detecting process by the write page address detector 100.

Hereinafter, operation of the write page address detector 100 which is configured as illustrated in FIG. 5 is described on the basis of the operation flow illustrated in FIG. 6.

First, the page address collator 101 loads data address DA corresponding to one write data D out of write data $D_0$ to $D_t$ in input write data WD (step S1). Next, the page address collator 101 determines a page including a bit position indicated by the data address DA, and collates a page address PPA indicative of the page with page addresses stored in the write page address storage 102 (step S2). Next, the page address collator 101 determines whether or not the page address identical to the page address PPA is already stored on the basis of the result of collation in step S2 (step S3). When it is determined in step S3 that the page address identical to the page address PPA is not stored, one page address register R corresponding to the count value of the input counter 103, among the page address registers $R_0$ to $R_k$, stores the page address PPA (step S4). After execution of step S4, the input counter 103 increments the count value by "1" (step S5).

When it is determined after execution of step S5 or in step S3 that the page address identical to the page address PPA is already stored, the page address collator 101 determines whether or not a write frequency counter (not illustrated) which counts the amount of data to be written has a count value equal to a specified write frequency (step S6). When it is determined in step S6 that the count value of the write frequency counter is not identical to the specified write frequency, i.e., when the count value is less than the specified write frequency, the page address collator 101 returns to step S1 where data address DA corresponding to subsequent write data D is loaded, and continues to execute steps S2 to S6.

As steps S1 to S6 are repeatedly executed, the page addresses indicative of the write target pages in one block are sequentially stored in the write page address storage 102 on the basis of the data addresses DA of each of the write data $D_0$ to $D_t$.

When the write data $D_0$ to $D_t$ are allocated in one block based on the data addresses DA as illustrated in FIG. 4 for example, page data such as $PGD_0$, $PGD_1$, and $PGD_3$, $PGD_k$ are selected as write target data, among the page data $PGD_0$ to $PGD_k$ corresponding to each of the (k+1) pages for one block. Therefore, the page addresses corresponding to each of $PGD_0$ of $PGD_1$, $PGD_3$, ..., $PGD_k$, among the page data $PGD_0$ to $PGD_k$, which contain write data D, are stored in the write page address storage 102 as the page addresses indicative of the write target pages. Since the page data $PGD_2$ does not contain write data D, the page data $PGD_2$ is excluded from the write target pages. As a result, the page address corresponding to page data $PGD_2$ is not stored in the write page address storage 102.

Figure 7:
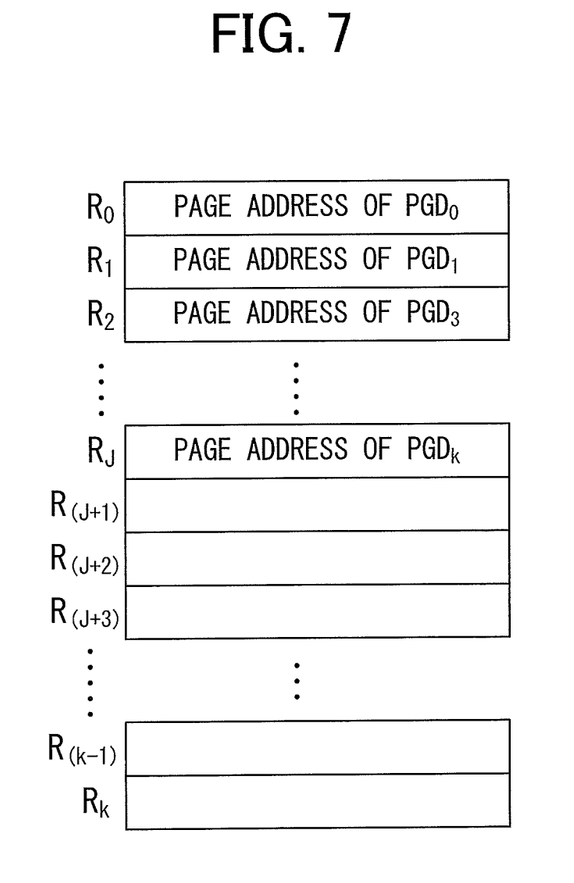
FIG. 7 is a diagram illustrating one example of page addresses stored in the page address registers $R_0$ to $R_k$.

The page address storage 102 includes (k+1) page address registers $R_0$ to $R_k$ corresponding to each of (k+1) pages for one block so as to store write target page addresses. However, in one block, there are pages excluded from the write target pages as described before. Therefore, when a page address corresponding to the last page of the write target pages is stored in a page address register $R_J$ (J is an integer less than k) as illustrated in FIG. 7 for example, the rest of the page address registers $R_{(J+1)}$ to $R_k$ are left in an initial state.

When it is determined in step S6 that the count value of the above-described write frequency counter is identical to the specified write frequency, the output selector 106 selects one storage content corresponding to the count value of the output counter 105, from among the storage contents of each of the page address registers $R_0$ to $R_k$, and outputs the selected memory content as a write page address ADw (step S7). Next, the output counter 105 increments the count value by "1" (step S8), and determines whether or not the count value is identical to the count value of the input counter 103 (step S 9). Until it is determined in the step S9 that the input counter 103 and the output counter 105 have an identical count value, the steps S7 to S9 are repeatedly performed.

As steps S7 to S9 are repeatedly performed, each of the page addresses stored in the write page address storage 102 is supplied to the column decoder 40 and the write buffer 70 as the write page address ADw. That is, only the page addresses indicative of the write target pages, among all the pages in one block, are supplied to the column decoder 40 and the write buffer 70 as the write page addresses ADw. The write buffer 70 supplies only the page data PGD corresponding to the pages indicated by the write page addresses ADw, among the page data $PGD_0$ to $PGD_k$ for one block, to the ECC part 60. Accordingly, the ECC part 60 supplies encoded write data PD, which is obtained by applying the error-correction encoding process to each of the page data PGD corresponding to the pages indicated by the write page addresses ADw, to the column decoder 40. The column decoder 40 applies a writing voltage based on the encoded write data PD to each of the bit lines connected to each of the memory cells belonging to the pages indicated by the write page addresses ADw so as to write the encoded write data PD to the memory cell array 10.

In short, the NOR flash memory 200 receives write data pieces ($D_0$ to $D_t$) consecutively applied thereto, and memorize the write data pieces in the memory cells while performing an access per a block unit consisting of k-pages (k is an integer of 2 or more). The NOR flash memory 200 includes the plurality of memory cells (10), the write page address detector (100), the write buffer (70), the ECC part (60), and the decoder (40).

That is, on the basis of the data addresses (DA) indicative of write bit positions of each of the write data pieces in each block, the write page address detector detects write page addresses (ADw) indicative of the pages having each of the write data pieces written thereto in each block. The write buffer incorporates at least one write data piece into each of the page data pieces indicated by the write page addresses, among k page data pieces (PGD) corresponding to the k pages, and obtains the page data pieces having the write data pieces incorporated therein as write page data pieces. The ECC part applies an error-correction encoding process to each of the write page data pieces to obtain encoded write data pieces. Then, the decoder applies a writing voltage based on the encoded write data pieces to each of the memory cells belonging to the pages indicated by the write page addresses so as to write each of the encoded write data pieces to the memory cell array.

As a result, the ECC part 60 may apply the error-correction encoding process only to the page data PGD corresponding to the pages indicated by the write page addresses ADw. Therefore, as compared with the case where the error-correction encoding process is applied to all the page data $PGD_0$ to $PGD_k$ for one block, process time used for writing can be reduced.

Furthermore, in the NOR flash memory 200, input write data $D_0$ to $D_t$ are incorporated into each of the page data PGD corresponding to each of the pages as illustrated in FIG. 4, and the error-correction encoding process is applied to the page data PGD. As a result, even in the semiconductor memory such as a NOR flash memory, in which input write data pieces may be different in sequence configuration from read data pieces read per page, highly reliable data access can be implemented using ECC.

This application is based on Japanese Patent Application No. 2015-99947 which is herein incorporated by reference.

What is claimed is:

1. A semiconductor memory system comprising:
   a NOR flash memory including a plurality of memory cells to which a plurality of blocks, each having a plurality of pages, is assigned; and
   a write control portion configured to receive consecutive write data pieces, and to store said write data pieces in said memory cells for each of the blocks, wherein said write control portion includes:
   a write page address storage configured to store, when it receives a write page address, the received write page address;
   a page address collator configured to determine, on the basis of the data addresses indicative of write bit positions in each of the blocks, a page address of a page in one of the blocks for writing each of said write data pieces and to output the determined page address as the write page address to said write page address storage when the determined page address is not stored in said write page address storage;
   an output part configured to sequentially read write page addresses stored in said write page address storage and to output the read write page addresses;
   a write buffer configured to incorporate at least one of said write data pieces into each of page data pieces indicated by the read write page addresses among first page data pieces corresponding to the plurality of pages respectively, and to output the page data pieces having said write data pieces incorporated therein;
   an ECC part configured to apply an error-correction encoding process to each of said page data pieces output by said write buffer to obtain encoded write data pieces, while ignoring each remaining page data piece other than the page data pieces having said write data pieces incorporated, among said first page data pieces; and
   a decoder configured to apply a writing voltage based on each of said encoded write data pieces to each of the memory cells belonging to the pages indicated by the read write page addresses.

2. The semiconductor memory system according to claim 1, wherein said ECC part outputs error-corrected data obtained by applying an error correction process to the data pieces in each of the pages read from the memory cells as read data.

3. A data writing method for writing write data pieces in a semiconductor memory system comprising a NOR flash memory including a plurality of memory cells to which a plurality of blocks, each block having a plurality of pages, is assigned, and a write page address storage configured to store, when it receives a write page address, the received write page address, said data writing method comprising:
   a write control step of receiving consecutive write data pieces, and storing said write data pieces in said memory cells for each of the blocks;
   a step of determining, on the basis of data addresses indicative of write bit positions in each of the blocks, a page address of a page in one of the blocks for writing each of said write data pieces, and supplying the determined page address as the write page address to said write page address storage when the determined page address is not stored in said write page address storage;
a step of sequentially reading write page addresses stored in said write page address storage;
a step of incorporating at least one of said write data pieces into each of page data pieces indicated by the read write page addresses among first page data pieces corresponding to the plurality of pages respectively, to issue the page data pieces having the write data pieces incorporated therein;
a step of applying an error-correction encoding process to each of the page data pieces to obtain encoded write data pieces, while ignoring each remaining page data piece other than the page data pieces having said write data pieces incorporated, among said first page data pieces; and
a step of applying a writing voltage based on each of the encoded write data pieces to each of the memory cells belonging to the pages indicated by the read write page addresses.

* * * * *